(12) United States Patent
Sudo

(10) Patent No.: US 6,518,766 B2
(45) Date of Patent: Feb. 11, 2003

(54) METHOD OF INSPECTING AN ELECTRICAL DISCONNECTION BETWEEN CIRCUITS BY CALCULATING PHYSICAL QUANTITIES THEREOF BASED ON CAPACITANCES REGARDING THE CIRCUITS MEASURED TWICE

(75) Inventor: Morishiro Sudo, Kawasaki (JP)

(73) Assignee: Fujitsu Automation Limited, Kawasaki (JP)

( * ) Notice: Subject to any disclaimer, the term of this patent is extended or adjusted under 35 U.S.C. 154(b) by 44 days.

(21) Appl. No.: 09/887,521

(22) Filed: Jun. 25, 2001

(65) Prior Publication Data

US 2002/0075008 A1 Jun. 20, 2002

(30) Foreign Application Priority Data

Oct. 30, 2000 (JP) .......................... 2000-331346

(51) Int. Cl.⁷ .................. G01R 31/08; G01R 31/02; G01R 27/08; H01H 31/02
(52) U.S. Cl. ................. 324/519; 324/537; 324/763; 324/678
(58) Field of Search .................. 324/519, 765, 324/678, 763, 537

(56) References Cited

U.S. PATENT DOCUMENTS

| | | | | |
|---|---|---|---|---|
| 4,439,727 A | * | 3/1984 | Boyle | 324/763 |
| 4,572,843 A | * | 2/1986 | Saito et al. | 427/554 |
| 4,831,325 A | * | 5/1989 | Watson, Jr. | 324/678 |
| 5,006,808 A | * | 4/1991 | Watts | 324/66 |
| 5,138,266 A | * | 8/1992 | Stearns | 324/537 |
| 5,187,430 A | * | 2/1993 | Marek et al. | 324/66 |
| 5,363,048 A | * | 11/1994 | Modlin et al. | 324/537 |
| 5,641,911 A | * | 6/1997 | Ryhanen | 73/718 |
| 5,744,964 A | * | 4/1998 | Sudo et al. | 324/537 |
| 5,999,010 A | * | 12/1999 | Arora et al. | 324/765 |

* cited by examiner

Primary Examiner—N. Le
Assistant Examiner—Wasseem H. Hamdan
(74) Attorney, Agent, or Firm—Armstrong, Westerman & Hattori, LLP

(57) ABSTRACT

A disconnection-inspecting method for inspecting an electrical disconnection between circuits formed on both surfaces of a board is provided. The method includes the steps of: placing the board on an insulating sheet laid on a reference conductor; measuring a first capacitance between the reference conductor and one of the circuits formed on a surface of both surfaces opposite to the other surface facing the insulating sheet; measuring a second capacitance between the reference conductor and the one of the circuits by changing a first physical quantity of the insulating sheet; calculating a second physical quantity of each of the circuits based on the first capacitance and the second capacitance measured in the steps of measuring; and judging the presence of the electrical disconnection based on the second physical quantity calculated in the step of calculating.

7 Claims, 6 Drawing Sheets

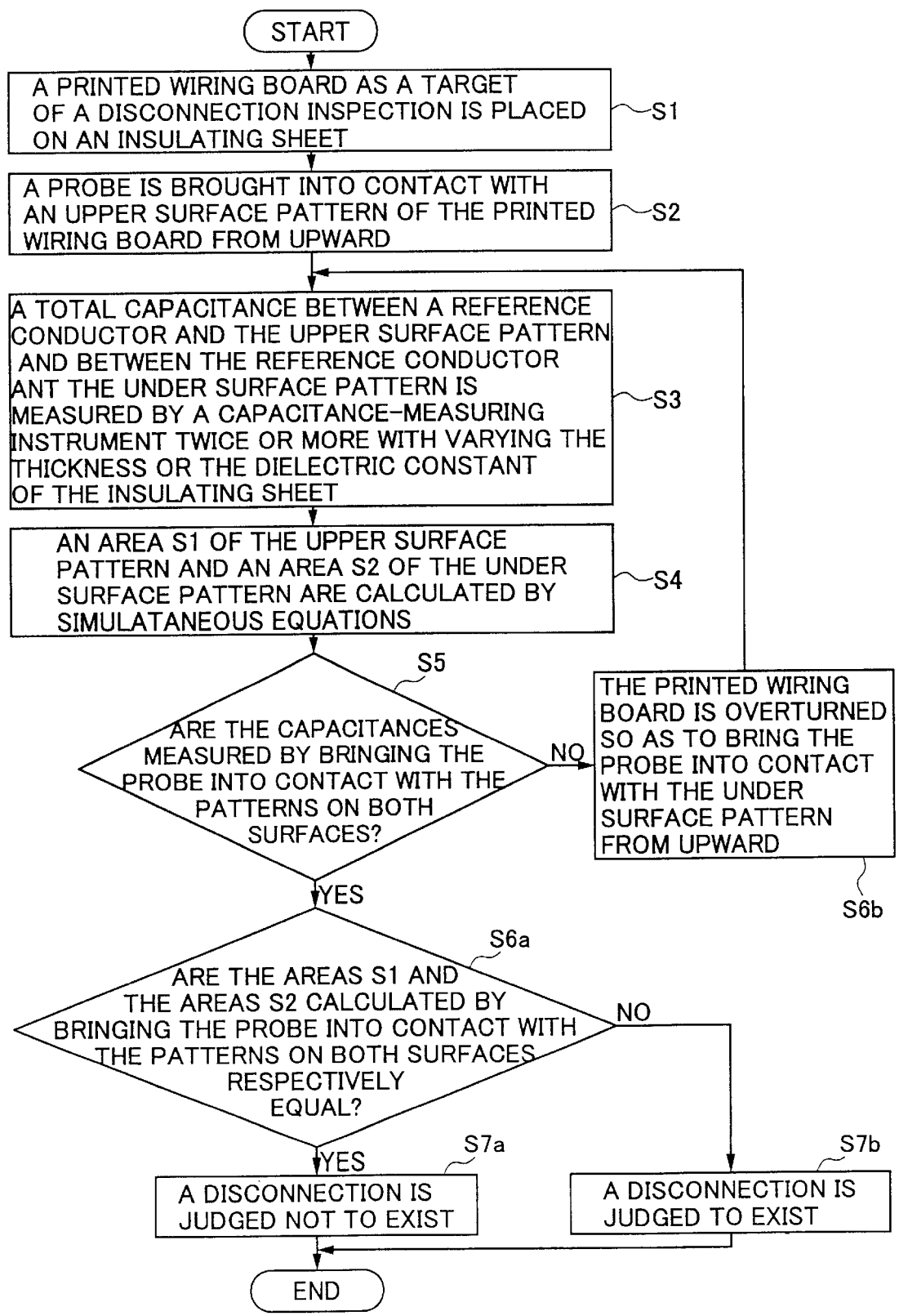

METHOD OF INSPECTING AN ELECTRICAL DISCONNECTION BETWEEN CIRCUITS BY CALCULATING PHYSICAL QUANTITIES THEREOF BASED ON CAPACITANCES REGARDING THE CIRCUITS MEASURED TWICE

BACKGROUND OF THE INVENTION

1. Field of the Invention

The present invention generally relates to a method for inspecting a disconnection in an electric circuit of a wiring board, more particularly, to a method for inspecting a disconnection in an electric connection between electric circuits formed on both surfaces of a printed wiring board.

2. Description of the Related Art

Recently, in guaranteeing a quality of a printed wiring board, a probe-moving inspecting method is widely applied, in which method a probe is brought into contact with the printed wiring board so as to inspect a disconnection in an electric wiring one by one. An inspection like this is required to be highly reliable.

Other conventional disconnection-inspecting methods include a method of contacting a probe on one surface of a printed wiring board, as follows. That is, in this method, first, a printed wiring board is placed on an insulating sheet laid on a reference conductor, and then a probe is brought into contact with a measurement pad on a circuit formed on the printed wiring board. Next, electric signals are supplied to the reference conductor and the circuit so as to measure an electric voltage and an electric current generated between the reference conductor and the circuit. Thereby such values as a capacitance are obtained so as to judge the presence of a disconnection in the electric circuit.

Conventional disconnection-inspecting methods also include, as a method for inspecting a disconnection in electric circuits formed on both (upper and under) surfaces of a printed board and connected to each other, a method of obtaining a capacitance value in the above-mentioned manner for each of a plurality of printed boards having a same circuit, and then estimating a disconnection from a distribution of the capacitance values by a majority method.

Conventional disconnection-inspecting methods also include a method of overturning such a printed board as above on a reference conductor so as to obtain capacitance values between each of circuits formed on both surfaces of the printed board and the reference conductor and then judging that a disconnection does not exist if the two obtained capacitance values are substantially equal.

However, there are problems that the above-mentioned conventional methods cannot find all-product inferiority in which a plurality of printed boards incur a same defect due to such a cause as a fault of a mask used in forming a circuit, and that the above-mentioned conventional methods cannot judge the presence of a disconnection in a case where there is only one printed board as a target of a disconnection inspection.

Additionally, in the above-mentioned methods including obtaining capacitance values as to both surfaces of a printed board, when a thickness of an insulating sheet is made so large that both capacitance values become equivalent, the capacitance measurement is required to be precise. Further, there is a problem in an inspection reliability that, in a case where areas of patterns of circuits on both surfaces are substantially equal, no difference is recognized in capacitance values on the upper and under surfaces, and consequently a disconnection is overlooked.

SUMMARY OF THE INVENTION

It is a general object of the present invention to provide an improved and useful disconnection-inspecting method in which the above-mentioned problems are eliminated.

A more specific object of the present invention is to provide a simple and reliable disconnection-inspecting method for inspecting a disconnection regarding an electric circuit.

In order to achieve the above-mentioned objects, there is provided according to one aspect of the present invention a disconnection-inspecting method for inspecting an electrical disconnection between circuits formed on both surfaces of a board, the method comprising the steps of:

placing the board on an insulating sheet laid on a reference conductor;

measuring a first capacitance between the reference conductor and one of the circuits formed on a surface of both surfaces opposite to the other surface facing the insulating sheet;

measuring a second capacitance between the reference conductor and the one of the circuits by changing a first physical quantity of the insulating sheet;

calculating a second physical quantity of each of the circuits based on the first capacitance and the second capacitance measured in the steps of measuring; and judging the presence of the electrical disconnection based on the second physical quantity calculated in the step of calculating.

According to the present invention, since an electrical disconnection is judged to be present or not based on the second physical quantity calculated from the measured capacitance values, the presence of an electrical disconnection in electric circuits can easily and surely be inspected. Additionally, since the present disconnection-inspecting method does not use a statistical method, the presence of a disconnection can be judged even in a case where there is only one board as a target of the inspection.

More specifically, in the disconnection-inspecting method according to the present invention, the first physical quantity may be a thickness or a dielectric constant of the insulating sheet. Additionally, the second physical quantity may be an area of each of the circuits so that the step of judging includes judging the presence of the electrical disconnection according to whether or not the area is calculated as 0.

In order to achieve the above-mentioned objects, there is also provided according to another aspect of the present invention a disconnection-inspecting method for inspecting an electrical disconnection between circuits formed on both surfaces of a board, the method comprising:

the first step of placing the board on an insulating sheet laid on a reference conductor;

the second step of measuring a first capacitance between the reference conductor and one of the circuits formed on a surface of both surfaces opposite to the other surface facing the insulating sheet;

the third step of measuring a second capacitance between the reference conductor and the one of the circuits by changing a first physical quantity of the insulating sheet;

the fourth step of calculating a second physical quantity of each of the circuits based on the first capacitance and the second capacitance measured in the steps of measuring;

the fifth step of overturning the board on the insulating sheet and repeating the second step to the fourth step; and the sixth step of judging the presence of the electrical disconnection according to whether or not the second physical quantity calculated in the fourth step and the second physical quantity calculated in the fifth step are equal.

According to the present invention, even in a case where circuits formed on both surfaces of a board are electrically connected by a plurality of leading wires and some of the leading wires have disconnected parts, the presence of the disconnection in the leading wires can surely and easily judged assuming that areas of patterns of circuits are different on both surfaces of the board.

More specifically, in the disconnection-inspecting method according to the present invention, the first physical quantity may be a thickness or a dielectric constant of the insulating sheet. Additionally, the second physical quantity may be an area of each of the circuits.

Other objects, features and advantages of the present invention will become more apparent from the following detailed description when read in conjunction with the accompanying drawings.

BRIEF DESCRIPTION OF THE DRAWINGS

FIG. 6 is a flowchart showing the disconnection-inspecting method for an electric circuit according to the second embodiment of the present invention.

DETAILED DESCRIPTION OF THE PREFERRED EMBODIMENTS

A description will now be given, with reference to the drawings, of embodiments according to the present invention. In the figures, same reference marks refer to identical or equivalent parts.

[FIRST EMBODIMENT]

Figure 1:
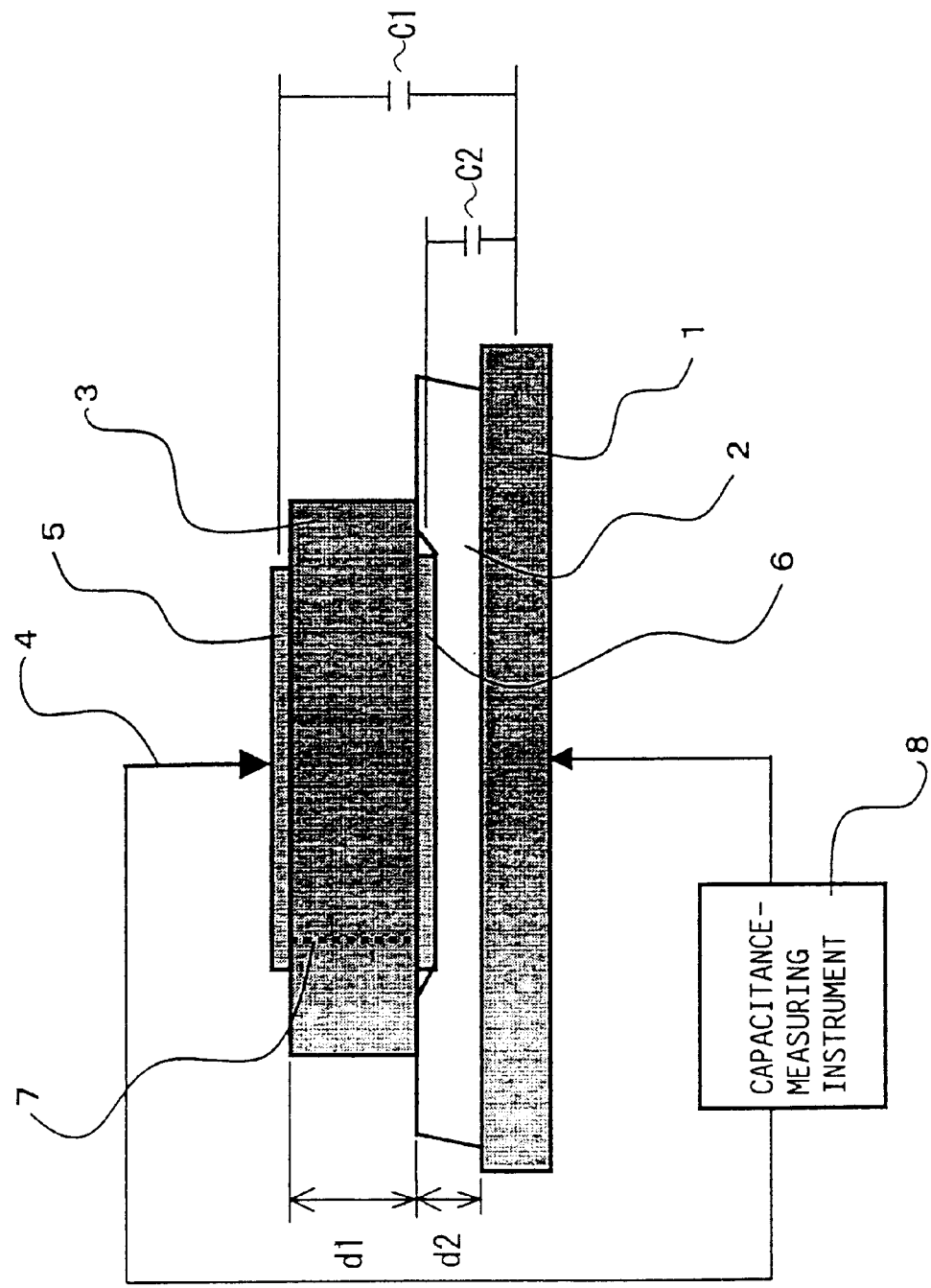
FIG. 1 is an illustration for explaining principles of a disconnection-inspecting method and a disconnection-inspecting device for an electric circuit according to a first embodiment of the present invention.

FIG. 1 is an illustration for explaining principles of a disconnection-inspecting method and a disconnection-inspecting device for an electric circuit according to a first embodiment of the present invention. As shown in FIG. 1, the disconnection-inspecting device for an electric circuit according to the first embodiment of the present invention comprises a reference conductor 1, an insulating sheet 2, and a probe 4. The insulating sheet 2 is placed on the reference conductor 1. A capacitance-measuring instrument 8 is connected between the reference conductor 1 and the probe 4.

On the insulating sheet 2 of the disconnection-inspecting device having the above-mentioned structure is placed a printed wiring board 3 having an upper surface pattern (circuit) 5, an under surface pattern 6, and a via hole 7. The printed wiring board 3 is a target of a disconnection inspection.

Figure 2:
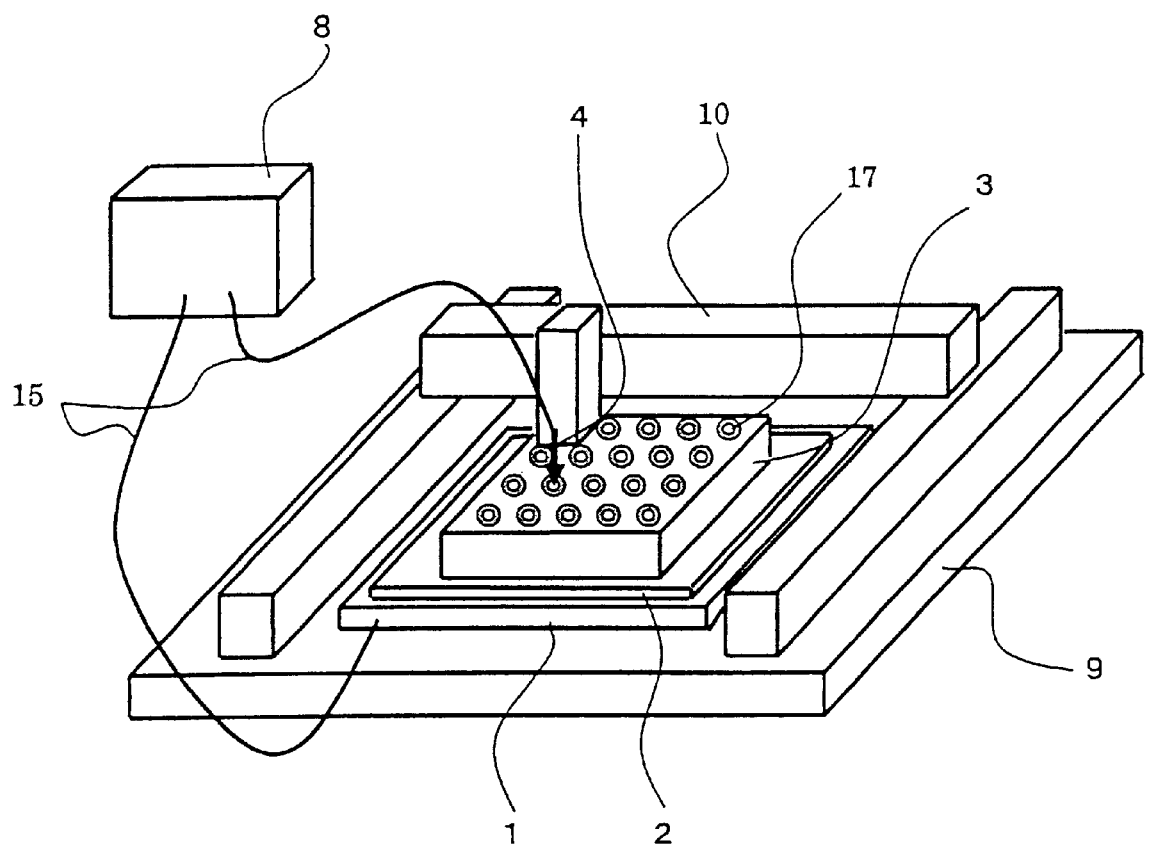
FIG. 2 is an illustration of the disconnection-inspecting device for an electric circuit according to the first embodiment of the present invention with a printed wiring board being placed thereon.

FIG. 2 is a perspective view showing a structure of the disconnection-inspecting device for an electric circuit according to the first embodiment of the present invention with the above-mentioned printed wiring board 3 being placed thereon. As shown in FIG. 2, in the disconnection-inspecting device according to the present embodiment, the reference conductor 1 is placed on a base board 9, on which a XYZ table 10 is further arranged. The capacitance-measuring instrument 8 is connected between the probe 4 and the reference conductor 1 by a cable 15. In addition, as shown in FIG. 2, measurement pads 17 are formed on the printed wiring board 3.

In the disconnection-inspecting device having the above-mentioned structure, the XYZ table 10 is moved so as to locate a tip of the probe 4 above the measurement pad 17 on the printed wiring board 3. Then, the probe 4 is brought down into contact with the measurement pad 17 so as to measure a capacitance regarding each of the measurement pads 17 one by one, the measurement pad 17 being as an electrode on one side.

Figure 3:
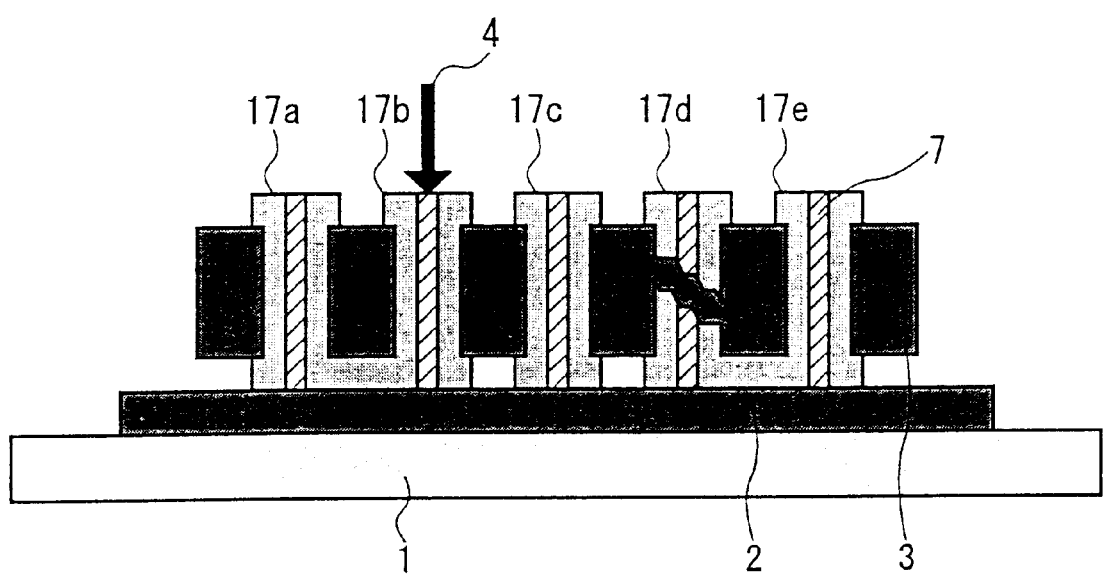
FIG. 3 is an illustration showing a cross-sectional structure of the printed wiring board and the disconnection-inspecting device shown in FIG. 2.

FIG. 3 is an illustration showing a cross-sectional structure of the printed wiring board 3 and the disconnection-inspecting device shown in FIG. 2. Hereinbelow, a description will be given, with the target of a disconnection inspection being the printed wiring board 3 having the measurement pads on both the upper and under surfaces electrically connected by the via holes 7, as shown in FIG. 3. FIG. 3 shows an example where measurement pads 17a to 17e are formed on the upper surface of the printed wiring board 3, and the measurement pad 17a and the measurement pad 17b, and the measurement pad 17d and the measurement pad 17e are electrically connected on the under surface, respectively. FIG. 3 further shows a disconnection fault in one of the via holes 7 connected to the measurement pad 17d.

The probe 4 is moved on the printed wiring board 3 having the above-mentioned structure into contact with the measurement pads 17a to 17e one by one so as to measure capacitances as described later.

Figure 4:
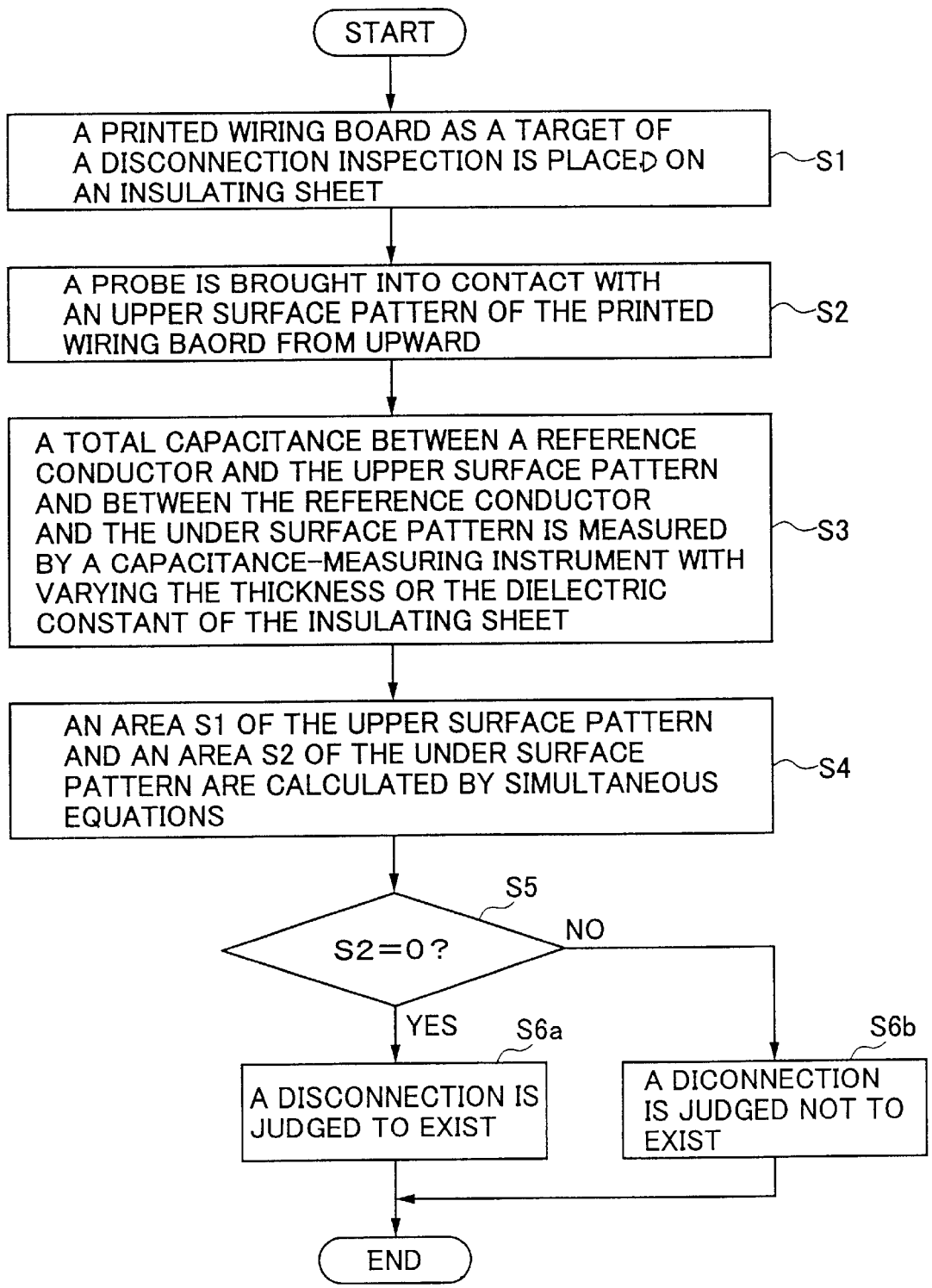
FIG. 4 is a flowchart showing the disconnection-inspecting method for an electric circuit according to the first embodiment of the present invention.

Next, a description will be given, with reference to a flowchart shown in FIG. 4, of the disconnection-inspecting method according to the first embodiment of the present invention. First, as shown in step S1, the printed wiring board 3 as a target of a disconnection inspection is placed on the insulating sheet 2.

Next, as shown in step S2, the probe 4 is brought into contact with the upper surface pattern 5 from upward. Then, in step S3, a total capacitance between the reference conductor 1 and the upper surface pattern 5 and between the reference conductor 1 and the under surface pattern 6 is measured by the capacitance-measuring instrument 8 with varying the thickness or the dielectric constant of the insulating sheet 2.

At this point, assuming that the area of the upper surface pattern 5 is S1, the capacitance between the upper surface pattern 5 and the reference conductor 1 is C1 as shown in FIG. 1, the area of the under surface pattern 6 is S2, the capacitance between the under surface pattern 6 and the reference conductor 1 is C2, the thickness of the printed wiring board 3 is d1, the dielectric constant thereof is $\epsilon 1$, the thickness of the insulating sheet 2 is d2, and the dielectric constant thereof is ε2, the total capacitance C of the entire circuit shown in FIG. 1 is expressed by the following expressions.

$$C = C1 + C2 \qquad \text{Expression (1)}$$

$$C1 = S1/(d1/\epsilon1 + d2/\epsilon2) \qquad \text{Expression (2)}$$

$$C2 = \epsilon2 \times S2/d2 \qquad \text{Expression (3)}$$

Accordingly, in step S3, the capacitance C is measured twice or more with varying d2 or ε2 of the foregoing expressions. Hereinafter, a description will be given, first, of a case of varying the thickness d2 of the insulating sheet 2. It is noted that the thickness d2 of the insulating sheet 2 can be varied easily, for example, by arranging several insulating sheets 2 one upon another, and that the dielectric constant ε2 of the insulating sheet 2 can be varied easily by differentiating the material of the insulating sheet 2.

Next, in step S4, using two or more measured values of the capacitance C obtained in step S3, the area S1 of the upper surface pattern 5 and the area S2 of the under surface pattern 6 are calculated by the foregoing expressions (1) to (3). At this point, the two or more values of the capacitance C measured with varying the thickness d2 or the dielectric constant ε2 of the insulating sheet 2 are substituted in the foregoing expressions (1) to (3) along with the varied values of the thickness d2 or the dielectric constant ε2 to make simultaneous equations so that the area S2 of the upper surface pattern 5 and the area S2 of the under surface pattern 6 are calculated uniquely, as described later.

For example, in a case where the dielectric constant ε1 of the printed wiring board 3 is 0.0425 pF/mm, the dielectric constant ε2 of the insulating sheet 2 is 0.06 pF/mm, and the thickness d1 of the printed wiring board 3 is 0.8 mm, when a measured value of the capacitance C with the thickness d2 of the insulating sheet 2 being 0.1 mm is 5.0928 pF, and a measured value of the capacitance C with the thickness d2 of the insulating sheet 2 being 0.2 mm is 2.6708 pF, the area S1 of the upper surface pattern 5 is calculated as 6 mm² and the area S2 of the under surface pattern 6 is calculated as 8 mm², as shown in table 1 below.

TABLE 1

| | Varying the thickness d2 | |
|---|---|---|
| d1 (mm) | 0.8 | 0.8 |
| d2 (mm) | 0.1 | 0.2 |
| S1 (mm²) | 6 | 6 |
| S2 (mm²) | 8 | 8 |
| ε1 (pF/mm) | 0.0425 | 0.0425 |
| ε2 (pF/mm) | 0.06 | 0.06 |
| C1 (pF) | 0.2928 | 0.2708 |
| C2 (pF) | 4.8 | 2.4 |
| C (pF) | 5.0928 | 2.6708 |

It is noted that, as shown in table 1, when the area S1 and the area S2 are obtained, the capacitance C1 and the capacitance C2 can also be calculated.

Here, a description will be given of a process of calculating the area S1 as 6 mm² and the area S2 as 8 mm² as above. When the thickness d2 of the insulating sheet 2 is 0.1 mm, the capacitance C is represented by the following expression.

$$C(d2 = 0.1) = C1 + C2 \qquad \text{Expression (4)}$$

$$= S1/(0.8/0.0425 + 0.1/0.06) +$$

$$0.06 \times S2/0.1$$

$$= 0.0488 \times S1 + 0.6 \times S2$$

On the other hand, when the thickness d2 of the insulating sheet 2 is 0.2 mm, the capacitance C is represented by the following expression.

$$C(d2 = 0.2) = C1 + C2 \qquad \text{Expression (5)}$$

$$= S1/(0.8/0.0425 + 0.2/0.06) +$$

$$0.06 \times S2/0.2$$

$$= 0.0451 \times S1 + 0.3 \times S2$$

In the above expressions (4) and (5), when a measured value of the capacitance C is 5.0928 pF with the thickness d2 of the insulating sheet 2 being 0.1 mm, and a measured value of the capacitance C is 2.6708 pF with the thickness d2 of the insulating sheet 2 being 0.2 mm, the simultaneous equations consisting of the expressions (4) and (5) can be solved so as to obtain the area S1 and the area S2 as shown in table 1 above.

On the other hand, with the same conditions as above except that a measured value of the capacitance C with the thickness d2 of the insulating sheet 2 being 0.1 mm is 0.2928 pF, and a measured value of the capacitance C with the thickness d2 of the insulating sheet 2 being 0.2 mm is 0.2708 pF, the area S1 of the upper surface pattern 5 is calculated as 6 mm² and the area S2 of the under surface pattern 6 is calculated as 0 mm² as shown in table 2 below, in the same process as above.

TABLE 2

| | Varying the thickness d2 | |
|---|---|---|
| d1 (mm) | 0.8 | 0.8 |
| d2 (mm) | 0.1 | 0.2 |
| S1 (mm²) | 6 | 6 |
| S2 (mm²) | 0 | 0 |
| ε1 (pF/mm) | 0.0425 | 0.0425 |
| ε2 (pF/mm) | 0.06 | 0.06 |
| C1 (pF) | 0.2928 | 0.2708 |
| C2 (pF) | 0 | 0 |
| C (pF) | 0.2928 | 0.2708 |

Next, in step S5, the area S2 of the under surface pattern 6 obtained in step S4 is judged to be 0 or not. Then, in a case of 0, step S6a is performed next, and in a case of not 0, step S6b is performed next. At this point, the area S2 being obtained as 0 means that the via hole 7 shown in FIG. 1 has a disconnected part, and consequently even when an electric current is provided between the upper surface pattern 5 and the reference conductor 1 by contacting the probe 4 with the upper surface pattern 5, an electric charge is not accumulated in the under surface pattern 6, as a result of which the capacitance C2 is not produced.

Thus, in the case of the area S2 being obtained as 0, step S6a is performed next, in which it is judged that an electrical disconnection exists between the upper surface pattern 5 and the under surface pattern 6 of the printed wiring board 3. On the other hand, in the case of the area S2 being obtained as not 0, step S6b is performed next, in which it is judged that an electrical disconnection does not exist between the upper surface pattern 5 and the under surface pattern 6 of the printed wiring board 3.

Besides, in each of a case where the insulating sheet 2 is a paper (the dielectric constant $\epsilon 2$ being 0.06) and a case where the insulating sheet 2 is a resin (the dielectric constant $\epsilon 2$ being 0.04), the capacitance C is measured as above so as to calculate the area S1 and the area S2 based on the measured values of the capacitance C, as shown in table 3 below.

TABLE 3

| | Varying the dielectric constant $\epsilon 2$ | |
|---|---|---|
| d1 (mm) | 0.8 | 0.8 |
| d2 (mm) | 0.1 | 0.1 |
| S1 (mm$^2$) | 6 | 6 |
| S2 (mm$^2$) | 8 | 8 |
| $\epsilon 1$ (pF/mm) | 0.0425 | 0.0425 |
| $\epsilon 2$ (pF/mm) | 0.06 | 0.04 |
| C1 (pF) | 0.2928 | 0.2814 |
| C2 (pF) | 4.8 | 3.2 |
| C (pF) | 5.0928 | 3.4814 |

Likewise, as in table 2, table 4 below shows a case where the area S2 is calculated as 0 based on measured values of the capacitance C.

TABLE 4

| | Varying the dielectric constant $\epsilon 2$ | |
|---|---|---|
| d1 (mm) | 0.8 | 0.8 |
| d2 (mm) | 0.1 | 0.1 |
| S1 (mm$^2$) | 6 | 6 |
| S2 (mm$^2$) | 0 | 0 |
| $\epsilon 1$ (pF/mm) | 0.0425 | 0.0425 |
| $\epsilon 2$ (pF/mm) | 0.06 | 0.04 |
| C1 (pF) | 0.2928 | 0.2814 |
| C2 (pF) | 0 | 0 |
| C (pF) | 0.2928 | 0.2814 |

As described above, with the disconnection-inspecting device and the disconnection-inspecting method according to the first embodiment, the probe 4 does not have to be contacted with the under surface of the printed wiring board 3, but only needs to be contacted with the upper surface thereof so as to measure capacitances. Such a simple method as this enables a precise inspection for the presence of a disconnection in an electric circuit.

Additionally, since the disconnection-inspecting device and the disconnection-inspecting method according to the first embodiment do not judge the presence of a disconnection by a statistical method, the presence of a disconnection can surely be inspected even in a case where there is only one printed wiring board 3 as a target of the inspection.

[SECOND EMBODIMENT]

Figure 5:
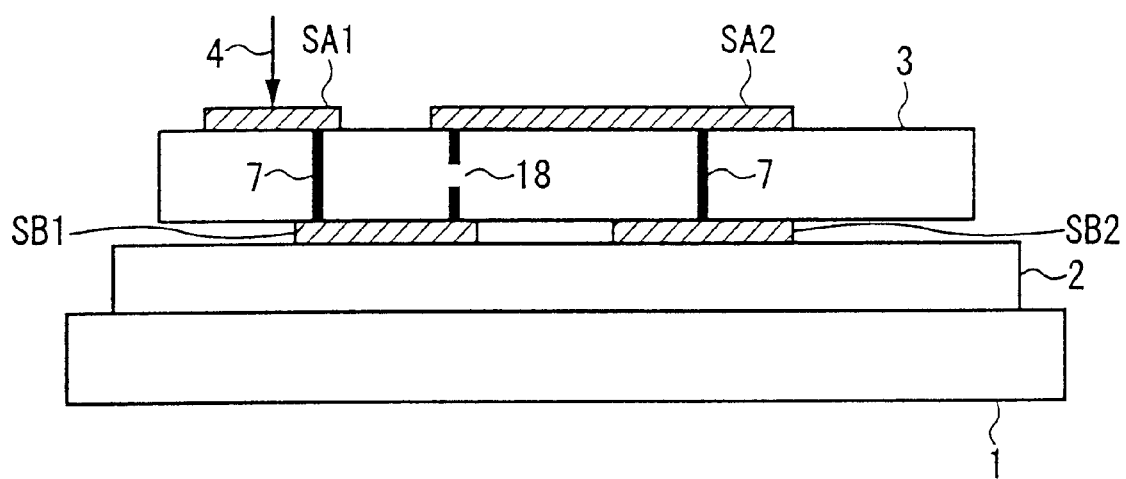
FIG. 5 is an illustration for explaining principles of a disconnection-inspecting method for an electric circuit according to a second embodiment of the present invention.

FIG. 5 is an illustration for explaining principles of a disconnection-inspecting method for an electric circuit according to a second embodiment of the present invention. As shown in FIG. 5, in the second embodiment of the present invention, the printed wiring board 3 used as a target of a disconnection inspection has a first upper surface pattern SA1 and a second upper surface pattern SA2 formed on the upper surface, a first under surface pattern SB1 and a second under surface pattern SB2 formed on the under surface, and the via holes 7 formed between the first upper surface pattern SA1 and the first under surface pattern SB1, between the second upper surface pattern SA2 and the second under surface pattern SB1, and between the second upper surface pattern SA2 and the second under surface pattern SB2.

Hereinbelow, a description will be given of a case where a disconnected part 18 is present in the via hole 7 formed between the second upper surface pattern SA2 and the second under surface pattern SB1, as shown in FIG. 5.

Additionally, for convenience' sake in explanation, it is assumed that, in the printed wiring board 3 shown in FIG. 5, although the sum of areas of the first upper surface pattern SA1 and the second upper surface pattern SA2 is equal to the sum of areas of the first under surface pattern SB1 and the second under surface pattern SB2, allocations of areas to the first pattern and the second pattern are different between the upper surface and the under surface, in other words, the area of the first upper surface pattern SA1 is not equal to the area of the first under surface pattern SB1, and the area of the second upper surface pattern SA2 is not equal to the area of the second under surface pattern SB2.

Accordingly, FIG. 5 shows the area of the first upper surface pattern SA1 being smaller than the area of the first under surface pattern SB1, as an example.

Hereinafter, a description will be given, with reference to a flowchart shown in FIG. 6, of the disconnection-inspecting method according to the second embodiment of the present invention. First, as shown in step S1, the printed wiring board 3 as a target of a disconnection inspection is placed on the insulating sheet 2.

Next, as shown in step S2, the probe 4 is brought into contact with an upper surface pattern from upward, the upper surface pattern being formed by the first upper surface pattern SA1 and the second upper surface pattern SA2. Then, in step S3, a total capacitance between the reference conductor 1 and the upper surface pattern and between the reference conductor 1 and an under surface pattern formed by the first under surface pattern SB1 and the second under surface pattern SB2 is measured by the capacitance-measuring instrument 8 twice or more with varying the thickness or the dielectric constant of the insulating sheet 2.

Then, in step S4, assuming that an area of the upper surface pattern is S1, and an area of the under surface pattern is S2, the area S1 and the area S2 are calculated by using the above-described expressions (1) to (3), as in the above-described first embodiment.

Next, in step S5, it is judged whether or not the capacitances are measured by arranging each of the patterns on both surfaces of the printed wiring board 3 to face upward and bringing the probe 4 into contact with the patterns on both surfaces in the same manner. Then, in a case that the capacitances are already measured as to the patterns on both surfaces of the printed wiring board 3, step S6a is performed next, and in a case that the capacitances are not yet measured as to the patterns on both surfaces of the printed wiring board 3, step S6b is performed next.

In step S6b, the printed wiring board 3 is overturned so as to bring the probe 4 into contact with the under surface pattern (now facing upward) from upward. Then, returning to step S3, step S3 and step S4 are repeated as to the patterns on both surfaces of the printed wiring board 3.

On the other hand, in step S6a, it is judged whether or not the areas S1 and the areas S2 calculated in step S4 by measuring the capacitances as to both surfaces are respectively equal. Then, in a case of being equal, step S7a is performed next, and in a case of being not equal, step S7b is performed next.

At this point, in a case where none of the via holes 7 is not disconnected in the printed wiring board 3, the area S1 becomes the sum of the areas of the first upper surface pattern SA1 and the second upper surface pattern SA2 formed on the upper surface of the printed wiring board 3, and the area S2 becomes the sum of the areas of the first under surface pattern SB1 and the second under surface pattern SB2 formed on the under surface of the printed wiring board 3. Accordingly, when the sum of the areas of the first and second upper surface patterns is equal to the sum of the areas of the first and second under surface patterns as assumed above, two sets of the area S1 and the area S2 calculated by measuring the capacitances as to both surfaces become equal.

On the other hand, in the case where the disconnected part 18 is present in the via hole 7 as shown in FIG. 5, and when the probe 4 is contacted with the first upper surface pattern SA1 in measuring capacitances, the area S1 becomes the area of the first upper surface pattern SA1, and the area S2 becomes the area of the first under surface pattern SB1. At this point, since the area of the first upper surface pattern SA1 is different from the area of the first under surface pattern SB1, when the disconnected part 18 exists, the two sets of the area S1 and the area S2 calculated by measuring the capacitances as to both surfaces become different.

Thus, in step S7a, it is judged that an electrical disconnection does not exist between the upper surface pattern and the under surface pattern of the printed wiring board 3. On the other hand, in step S7b, it is judged that an electrical disconnection exists between the upper surface pattern and the under surface pattern of the printed wiring board 3.

As described above, with the disconnection-inspecting device according to the second embodiment and the disconnection-inspecting method using the device, in a case where the printed wiring board 3 as a target of an disconnection inspection has circuit patterns formed on both surfaces, each of the circuit patterns comprises a plurality of regions, and the circuit patterns on different surfaces are electrically connected by the via holes 7, in which, although an area of the circuit pattern on the upper surface is equal to an area of the circuit pattern on the under surface, an area of each of the regions on the upper surface is different from an area of each of the regions on the under surface, the presence of a disconnection in the via holes 7 electrically connecting the upper and under surfaces can be surely and easily inspected.

The present invention is not limited to the specifically disclosed embodiments, and variations and modifications may be made without departing from the scope of the present invention.

The present application is based on Japanese priority application No.2000-331346 filed on Oct. 30, 2000, the entire contents of which are hereby incorporated by reference.

What is claimed is:

1. A disconnection-inspecting method for inspecting an electrical disconnection between circuits formed on both surfaces of a board, the method comprising the steps of:

placing said board on an insulating sheet laid on a reference conductor;

measuring a first capacitance between said reference conductor and one of said circuits formed on a surface of said both surfaces opposite to the other surface facing said insulating sheet;

measuring a second capacitance between said reference conductor and said one of said circuits by changing a thickness and or dielectric constant of said insulating sheet;

calculating an area of each of said circuits based on said first capacitance and said second capacitance measured in the steps of measuring; and judging the presence of the electrical disconnection based on said area calculated in the step of calculating.

2. The disconnection-inspecting method as claimed in claim 1, wherein said first physical quantity is a thickness of said insulating sheet.

3. The disconnection-inspecting method as claimed in claim 1, wherein said first physical quantity is a dielectric constant of said insulating sheet.

4. The disconnection-inspecting method as claimed in claim 1, wherein the step of judging includes judging the presence of the electrical disconnection according to whether or not said area is calculated as 0.

5. A disconnection-inspecting method for inspecting an electrical disconnection between circuits formed on both surfaces of a board, the method comprising:

the first step of placing said board on an insulating sheet laid on a reference conductor;

the second step of measuring a first capacitance between said reference conductor and one of said circuits formed on a surface of said both surfaces opposite to the other surface facing said insulating sheet;

the third step of measuring a second capacitance between said reference conductor and said one of said circuits by changing a thickness and or dielectric constant of said insulating sheet;

the fourth step of calculating an area of each of said circuits based on said first capacitance and said second capacitance measured in the steps of measuring;

the fifth step of overturning said board on said insulating sheet and repeating the second step to the fourth step; and the sixth step of judging the presence of the electrical disconnection according to whether or not said area calculated in the fourth step and said area calculated in the fifth step are equal.

6. The disconnection-inspecting method as claimed in claim 5, wherein said first physical quantity is a thickness of said insulating sheet.

7. The disconnection-inspecting method as claimed in claim 5, wherein said first physical quantity is a dielectric constant of said insulating sheet.

* * * * *